United States Patent

Naem

Patent Number: 5,824,596
Date of Patent: Oct. 20, 1998

[54] POCL₃ PROCESS FLOW FOR DOPING POLYSILICON WITHOUT FORMING OXIDE PILLARS OR GATE OXIDE SHORTS

[75] Inventor: Abdalla A. Naem, Sunnyvale, Calif.

[73] Assignee: National Semiconductor Corporation, Santa Clara, Calif.

[21] Appl. No.: 689,335

[22] Filed: Aug. 8, 1996

[51] Int. Cl.⁶ .................................................. H02L 21/77
[52] U.S. Cl. ...................... 438/566; 438/482; 438/558; 438/585; 438/705; 438/753
[58] Field of Search ..................... 438/565, 567, 438/558, 563, 753, 705, 659, 585, 564, 566, 482

[56] References Cited

U.S. PATENT DOCUMENTS

| | | | |
|---|---|---|---|
| 4,443,930 | 4/1984 | Hwang et al. | 438/299 |
| 5,114,870 | 5/1992 | Yatsuda et al. | 438/275 |
| 5,736,419 | 4/1998 | Naem | 438/300 |

*Primary Examiner*—John Niebling
*Assistant Examiner*—Ha Tran Nguyen
*Attorney, Agent, or Firm*—Limbach & Limbach L.L.P.

[57] ABSTRACT

In a method of introducing phosphorous from phosphorous oxychloride (POCl₃) into an undoped gate polysilicon region formed as part of an integrated circuit structure, an initial MOS structure is developed utilizing conventional techniques through the formation of a layer of undoped polysilicon over thin gate oxide. A POCl₃ layer is then formed over the undoped polysilicon and thermally annealed to drive phosphorous into the gate polysilicon to achieve a desired conductivity level. The phosphorous-rich organic layer is then cleaned from the surface of the POCl₃ using sulfuric peroxide and the POCl₃ layer is removed using a DI:HF solution to expose the surface of the doped polysilicon. After formation of a photoresist gate mask, arsenic, or another heavy ion species, is implanted into the exposed polysilicon to amorphized the exposed poly, thereby eliminating the polysilicon grain boundaries. This leads to uniform etching of the amorphized poly and, therefore, disappearance of the oxide pillars. Removal of the organic layer from the POCl₃ Layer prior to the HF deglaze step facilitates smooth, uniform etching of the POCl₃ in reduced time, thereby eliminating the gate oxide holes experienced in the conventional process flow.

7 Claims, 4 Drawing Sheets

POCL₃ PROCESS FLOW FOR DOPING POLYSILICON WITHOUT FORMING OXIDE PILLARS OR GATE OXIDE SHORTS

BACKGROUND OF THE INVENTION

1. Field of the Invention

The present invention relates to fabrication techniques for integrated circuit structures and, in particular, to a process flow for thermally driving phosphorous from a phosphorous oxychloride ($POCl_3$) layer into underlying polysilicon to establish a desired conductivity level in the polysilicon, but without forming the oxide pillars or gate oxide shorts experienced in the conventional process flow.

2. Discussion of Related Art

In the manufacture of semiconductor integrated circuits, it is common to utilize doped polysilicon to provide conductive gate structures for MOS devices. Typically, the polysilicon gate is doped to a desired conductivity level by forming an overlying layer of phosphorous oxychloride ($POCl_3$) and then annealing the $POCl_3$ layer to drive the phosphorous into the polysilicon.

A typical $POCl_3$ process flow is illustrated in FIGS. 1A–1F.

FIG. 1A shows the initial device structure through deposition of the undoped gate polysilicon layer 100. As shown in FIG. 1B, a layer of $POCl_3$ film 102 is then deposited over the undoped polysilicon 100. Next, as shown in FIG. 1C, a $POCl_3$ anneal step is performed to drive phosphorous from the $POCl_3$ film 102 into the underlying polysilicon to form a doped polysilicon layer 104. Following the $POCl_3$ anneal step, a deglazing step is performed using DI-HF (10:1) etching solution to remove the $POCl_3$ layer.

During the $POCl_3$ anneal step, when the phosphorous is driven from the $POCl_3$ into the polysilicon, most of the phosphorous segregates into the polysilicon grain boundaries and forms heavily doped phosphorous oxide, which etches very fast in HF solutions. Also during the $POCl_3$ deposition, a thin (100–200 Å) phosphorous-rich organic layer is formed on the surface of the $POCl_3$ layer. This phosphorous-rich organic layer must be removed before the wet HF solution can be effectively used to remove the $POCl_3$ layer underneath. The wet DI:HF solution will reach the $POCl_3$ layer through holes formed in the phosphorous-rich layer. The HF will take longer to remove the $POCl_3$ layer because of the masking caused by the phosphorous-rich layer. This will allow the HF, in some areas where the etching went faster, to penetrate into the grain boundaries in the polysilicon, remove the heavily doped oxide and reach the underlying thin gate oxide layer 108. When the HF solution penetrates the polysilicon layer 104 and reaches the thin gate oxide layer 108, it attacks the gate oxide, forming holes 106 and, therefore, polysilicon-to-substrate shorts, as shown in FIG. 1D.

Referring to FIG. 1E, following the $POCl_3$ deglaze step, a gate polysilicon photomasking step, required for patterning the gate polysilicon film 104, is performed to define a patterned photoresist layer 110 on the doped polysilicon 104. As shown in FIG. 1F, the gate polysilicon 104 is then etched and the photoresist 110 is removed to define the polysilicon gate 112 of the MOS device.

However, during the polysilicon etch step, oxide residue "pillars" 114 are generated on the field/source/drain oxide areas. That is, during polysilicon patterning, the oxide present at the polysilicon grain boundaries in areas where the HF solutions did not penetrate will not be attacked by the polysilicon etch and, hence, will remain on the field oxide and on the source/drain oxide, forming what are commonly referred to as oxide "pillars." These pillars present severe reliability hazards for the final product.

FIG. 1F shows the final polysilicon gate structure obtained by the conventional process flow, including the polysilicon-to-substrate shorts through the holes in the gate oxide as well as the oxide pillars formed on the field and source/drain oxide.

Thus, although the conventional $POCl_3$ process flow is adequate for large geometry dimensions, where the gate oxide is thick enough (i.e., greater than 200 Å) to withstand attack by the HF deglaze solution and the product is not sensitive to oxide residues left on the surface of the thermal oxides, in ULSI processes, the conventional $POCl_3$ process is not adequate because of the small dimensions of the device, which require high degrees of cleanliness and thin gate oxides (i.e., less than 100 Å).

SUMMARY OF THE INVENTION

The present invention provides a new method of introducing phosphorous into undoped gate polysilicon. In accordance with the method, an initial MOS structure is developed utilizing conventional techniques up to the formation of an undoped gate polysilicon layer over thin gate oxide. A layer of phosphorous oxychloride ($POCl_3$) is then formed over the undoped polysilicon and thermally annealed to drive phosphorous from-the $POCl_3$ layer into the polysilicon to dope the gate polysilicon to a desired conductivity level. The phosphorous-rich organic layer is then removed from the surface of the $POCl_3$ using sulfuric peroxide. The $POCl_3$ layer is then removed using a DI:HF solution to expose the surface of the underlying doped polysilicon. After formation of a photoresist gate mask over the doped polysilicon layer, an ion implantation step is performed, using arsenic or other heavy ion species, to amorphize the polysilicon layer and, thus, destroy the grain boundaries by mixing the oxide at the grain boundaries with the polysilicon. This leads to uniform polysilicon etching and, therefore, the disappearance of the oxide pillars problem. Removal of the phosphorous-rich organic layer from the surface of the $POCl_3$ prior to the HF deglaze step facilitates a smooth, uniform etch of the $POCl_3$ in a significantly reduced etch time, thereby eliminating the formation of holes in the underlying gate oxide.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

A process flow for doping polysilicon using phosphorous oxychloride ($POCl_3$) in accordance with the present invention will now be described in conjunction with the partial cross-sectional drawings provided in FIGS. 2A–2H. While no specific process parameters (e.g. film thicknesses, dopant concentrations, etc.) are provided, those skilled in the art will appreciate that the concepts of the invention are applicable regardless of these parameters, which will differ depending upon the specific integrated circuit product under manufacture. Those skilled in the art will also appreciate that, while the following discussion is directed to the fabrication of N-channel devices, the concepts of the invention apply to all MOS technologies and, in fact, to all process flows that utilize phosphorous-doped polysilicon.

Figure 1A:
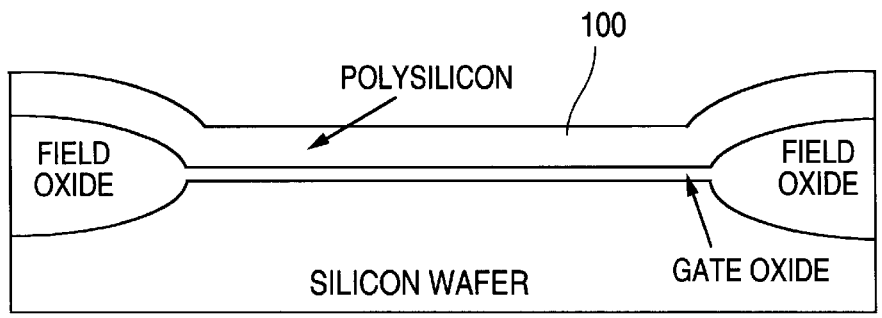
FIGS. 1A–1F are partial cross-sectional drawings of a semiconductor structure illustrating the sequential steps of a conventional $POCl_3$ process flow.
Figure 1B:
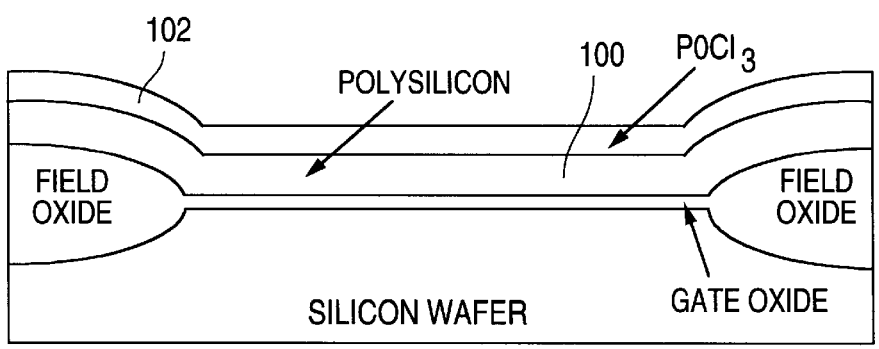
Figure 1C:
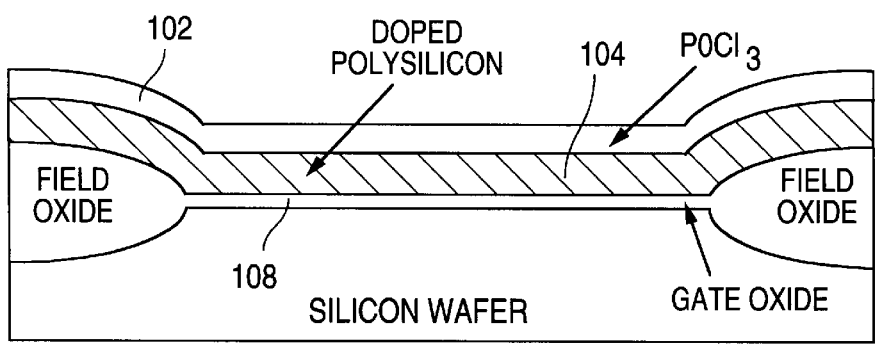
Figure 1D:
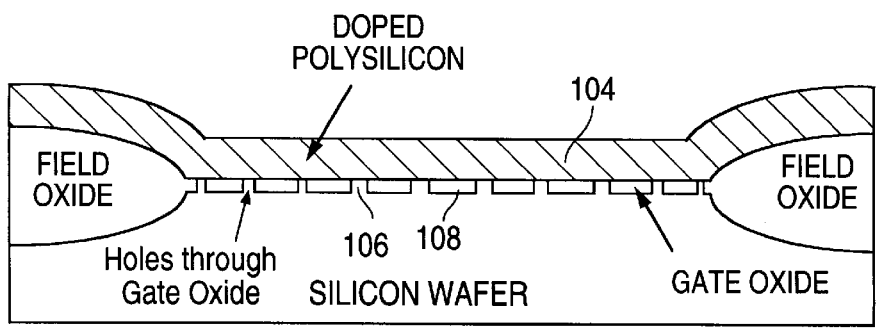
Figure 1E:
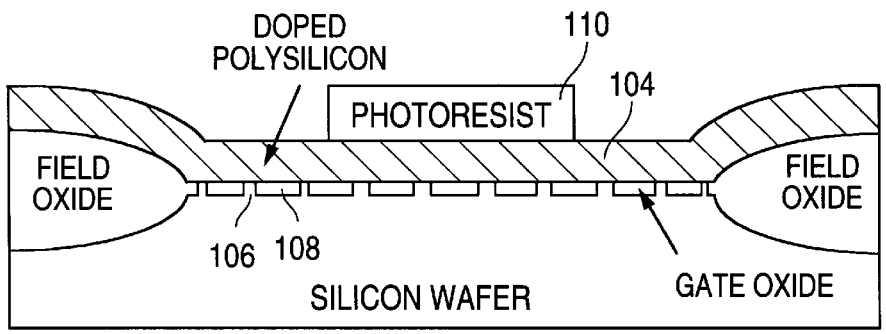
Figure 1F:
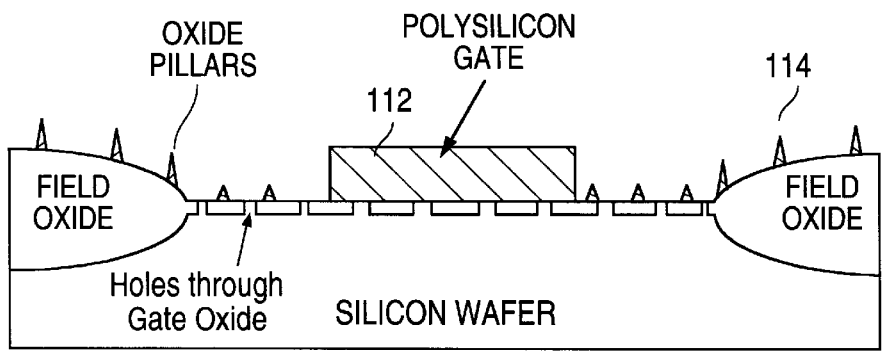
Figure 2A:
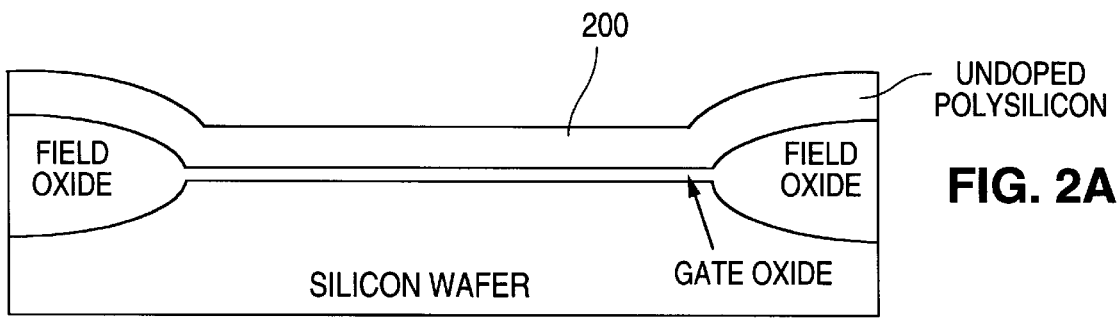
FIGS. 2A–2H are partial cross-sectional drawings of a semiconductor integrated circuit structure illustrating the sequential steps of a $POCl_3$ process flow in accordance with the present invention.

Referring to FIG. 2A, an initial MOS structure is developed utilizing conventional techniques through formation of a layer 200 of undoped polysilicon.

Figure 2B:
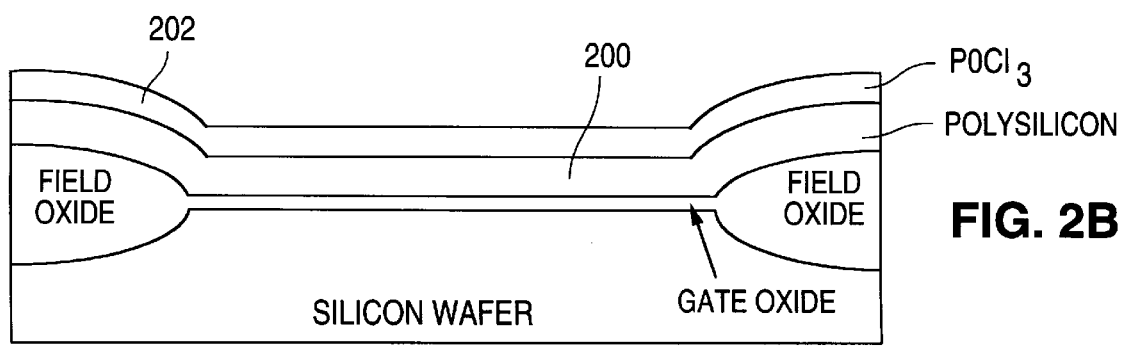
Figure 2C:
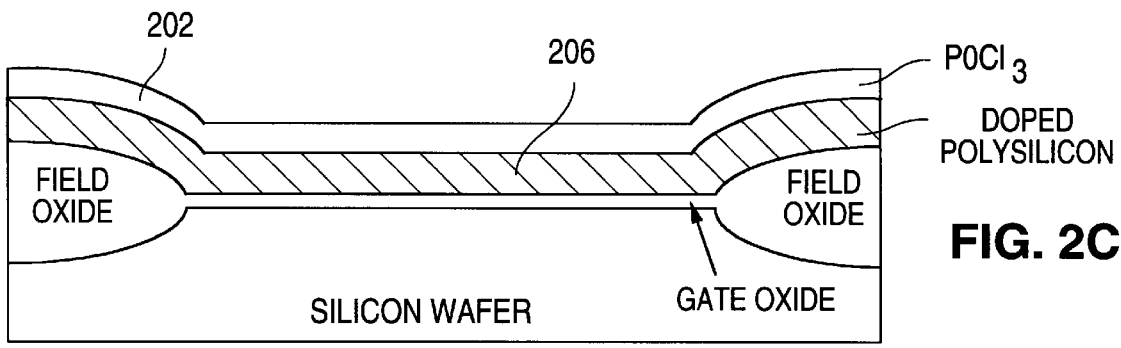

Next, as shown in FIG. 2B, a $POCl_3$ film 202 is deposited over the entire structure. As discussed above, the formation of the $POCl_3$ layer results in the formation of a phosphorous-rich organic layer (not shown) on the surface of the $POCl_3$. The $POCl_3$ film 202 is then thermally annealed to drive phosphorous from the $POCl_3$ into the gate polysilicon 200, resulting in a polysilicon layer 206 that is doped to a desired conductivity level.

Figure 2D:
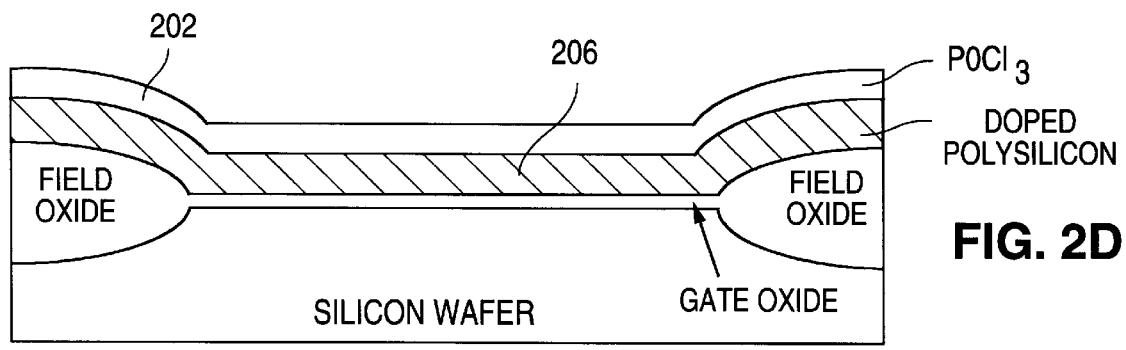

Following the anneal, the phosphorous-rich organic layer is removed using an industry-standard sulfuric peroxide wet clean, resulting in the structure shown in FIG. 2D.

Figure 2E:
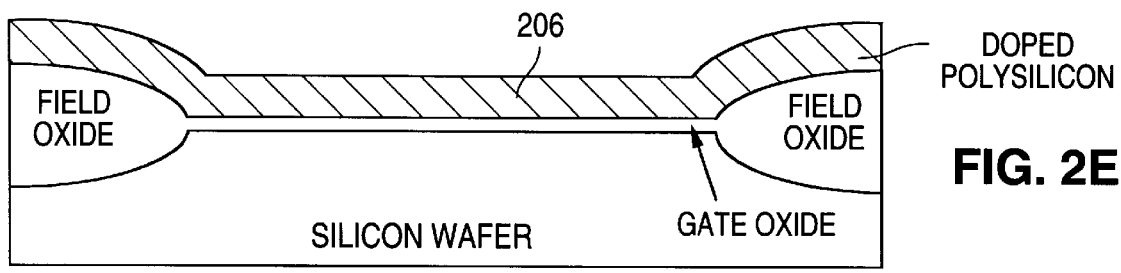

Next, the $POCl_3$ layer 202 is removed in a deglazing step using a DI:HF (10:1) etch to expose the surface of the underlying doped polysilicon layer 206, as shown in FIG. 2E.

Figure 2F:
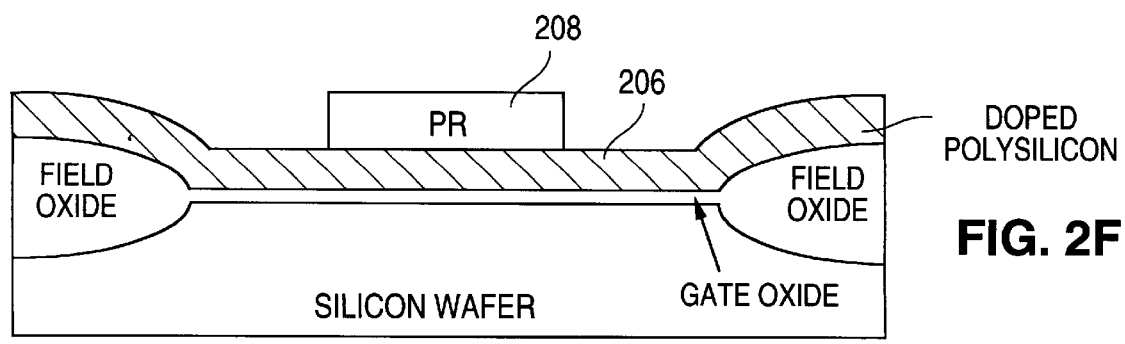
Figure 2G:
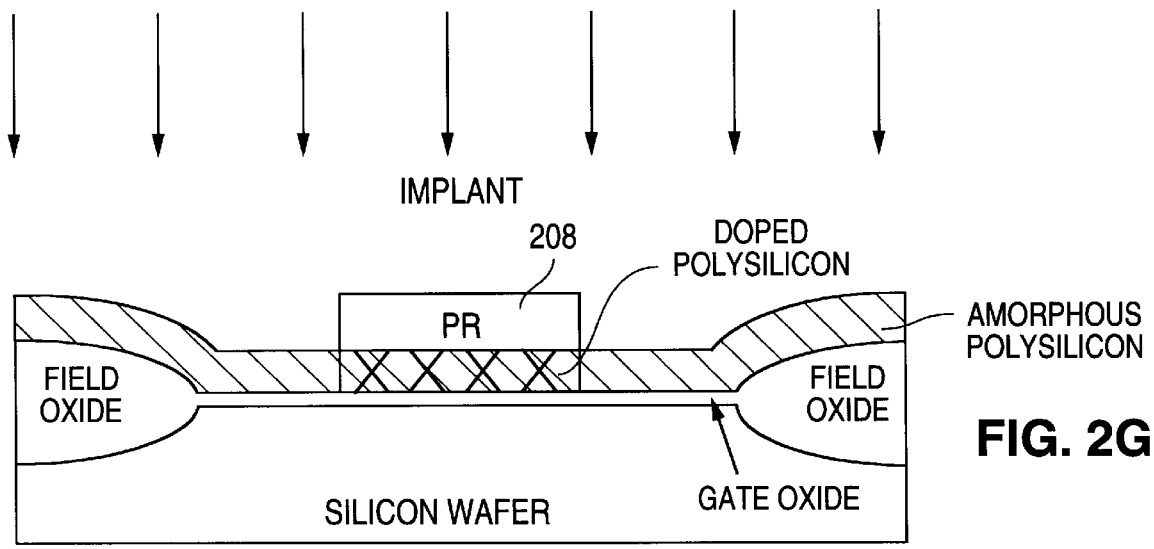

After patterning a photoresist mask 208 over the doped polysilicon layer 206, as shown in FIG. 2F, an ion implantation step is performed as shown in FIG. 2G using arsenic, or other heavy ion species such as antimony or germanium. The recommended As+implant conditions are 4.5E15@100 Kev.

The ion implantation amorphizes the exposed doped polysilicon layer 206 and, thus, destroys the grain boundaries, mixing the oxide resulting form the thermal anneal step with the polysilicon.

Figure 2H:
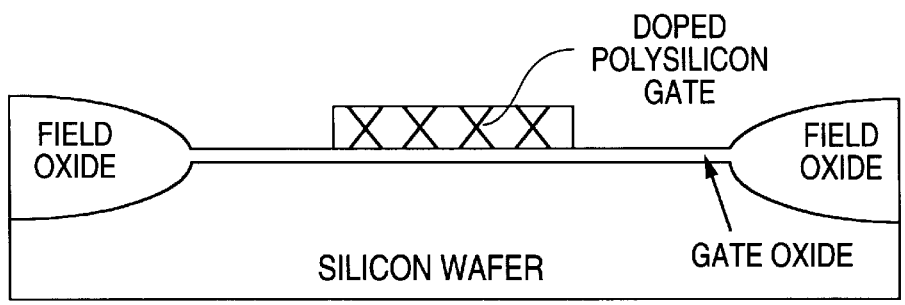

The exposed, amorphized polysilicon is then removed, as is the photoresist mask 208, resulting in the structure shown in FIG. 2H without the gate oxide holes and the oxide residue experienced when the conventional process flow is utilized.

The MOS device structure is then completed in accordance with conventional techniques well known to those skilled in the art.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A method introducing phosphorous into a layer of polysilicon, the method comprising:

(a) forming a layer of source material including phosphorous oxychloride ($POCl_3$) on the layer of polysilicon;

(b) utilizing heat to transfer phosphorous from the source layer to the layer of polysilicon;

(c) removing a surface portion of the layer of source material;

(d) removing the layer of source material that remains after step (c), utilizing a solution including HF, to expose the layer of polysilicon;

(e) masking the layer of polysilicon to define exposed portions of the layer of polysilicon;

(f) amorphizing the exposed portions of the layer of polysilicon; and (g) removing the amorphized portions of the layer of polysilicon.

2. A method of introducing phosphorous into an undoped polysilicon region formed as part of an integrated circuit structure, wherein the polysilicon region overlies oxide material formed on an active device region of a semiconductor substrate, the active device region defined by field oxide formed in the semiconductor substrate, the method comprising:

(a) forming a $POC_3$ layer over the polysilicon layer;

(b) thermally annealing the $POC_3$ layer to drive phosphorous from the $POC_3$ layer into the underlying polysilicon layer;

(c) cleaning the surface of the $POC_3$ layer using sulfuric peroxide;

(d) removing the $POC_3$ layer using an HF solution;

(e) forming a gate mask over the polysilicon layer to define an underlying gate polysilicon region and exposed portions of the polysilicon layer;

(f) implanting ions into the exposed portions of the polysilicon layer to amorphize the exposed portions;

(g) removing the amorphized exposed portions; and (h) removing the photoresist mask.

3. A method of forming a doped polysilicon gate of a MOS transistor formed in a semiconductor substrate, the method comprising:

(a) forming regions of isolation oxide in the semiconductor substrate to define an active device region in the semiconductor substrate;

(b) forming a layer of gate silicon oxide on a surface of the active device region;

(c) forming a layer of polysilicon on the layer of gate silicon oxide;

(d) forming a layer of source material including $POCl_3$ on the layer of polysilicon;

(e) thermally annealing the $POCl_3$ layer, thereby driving phosphorous from the $POCl_3$ layer into the layer of polysilicon;

(f) removing an upper surface portion of the $POCl_3$ layer;

(g) removing the layer of $POCl_3$ that remains after step (f), using a solution including HF, to expose the layer of polysilicon;

(h) forming a photoresist mask over the polysilicon layer to define an underlying gate polysilicon region and exposed portions of the polysilicon layer;

(i) implanting ions into the exposed portions of the polysilicon layer to amorphize the exposed portions;

(j) removing the amorphized exposed portions of the polysilicon layer.

4. A method as in claim 3 wherein the upper surface portion of the $POCl_3$ layer is removed using sulfuric peroxide.

5. A method as in claim 4 wherein the solution including HF comprises DI-HF (10:1).

6. A method as in claim 5 wherein the ions implanted into the exposed portions of the polysilicon layer include arsenic.

7. A method as in claim 5 wherein the ions implanted into the exposed portions of the polysilicon layer are selected from arsenic, antimony and germanium.

* * * * *

UNITED STATES PATENT AND TRADEMARK OFFICE
CERTIFICATE OF CORRECTION

PATENT NO.: 5,824,596
DATED: October 20, 1998
INVENTOR(S): Abdalla A. Naem

It is certified that five errors appear in the above-identified patent and that said Letters Patent is hereby corrected as shown below:

In Col. 4, line 13, delete "$POC_3$" and replace with --$POCl_3$--.

In Col. 4, line 14, delete "$POC_3$" and replace with --$POCl_3$--.

In Col. 4, line 15, delete "$POC_3$" and replace with --$POCl_3$--.

In Col. 4, line 17, delete "$POC_3$" and replace with --$POCl_3$--.

In Col. 4, line 19, delete "$POC_3$" and replace with --$POCl_3$--.

Signed and Sealed this

Twelfth Day of January, 1999

Attest:

*Attesting Officer*  *Acting Commissioner of Patents and Trademarks*